United States Patent
Greene et al.

(10) Patent No.: US 7,463,061 B1
(45) Date of Patent: Dec. 9, 2008

(54) APPARATUS AND METHOD FOR REDUCING LEAKAGE OF UNUSED BUFFERS IN AN INTEGRATED CIRCUIT

(75) Inventors: Jonathan W. Greene, Palo Alto, CA (US); Vidya Bellippady, Cupertino, CA (US)

(73) Assignee: Actel Corporation, Mountain View, CA (US)

( * ) Notice: Subject to any disclaimer, the term of this patent is extended or adjusted under 35 U.S.C. 154(b) by 88 days.

(21) Appl. No.: 11/185,426

(22) Filed: Jul. 19, 2005

(51) Int. Cl.
*H03K 19/20* (2006.01)
(52) U.S. Cl. ............................ 326/41; 326/113; 326/38
(58) Field of Classification Search ................. 326/113, 326/41
See application file for complete search history.

(56) References Cited

U.S. PATENT DOCUMENTS

| 5,200,907 | A | * | 4/1993 | Tran ............................ 326/113 |
| 6,271,685 | B1 | * | 8/2001 | Nagasawa et al. ............ 326/113 |
| 6,720,797 | B2 | * | 4/2004 | Sasaki ......................... 326/113 |
| 6,768,338 | B1 | * | 7/2004 | Young et al. .................. 326/44 |

* cited by examiner

*Primary Examiner*—Vibol Tan
(74) *Attorney, Agent, or Firm*—Lewis and Roca LLP

(57) ABSTRACT

A reduced-leakage interconnect circuit includes a buffer having an input and an output, at least one multiplexer transistor coupled between a multiplexer input node and the input of the buffer, and a fixed-state multiplexer transistor coupled between a fixed-state multiplexer input node and the input of the buffer, the fixed-state multiplexer input node having a potential of either less than zero volts or more than $V_{CC}$ present on it.

9 Claims, 1 Drawing Sheet

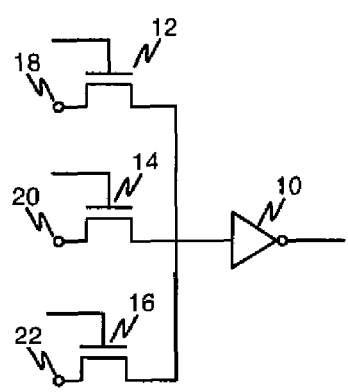
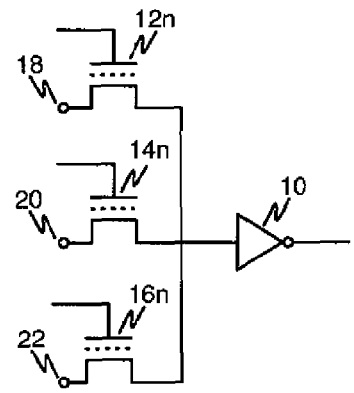
FIGURE 1A
FIGURE 1B
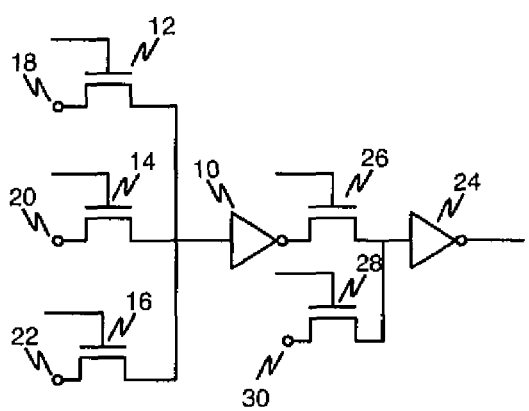
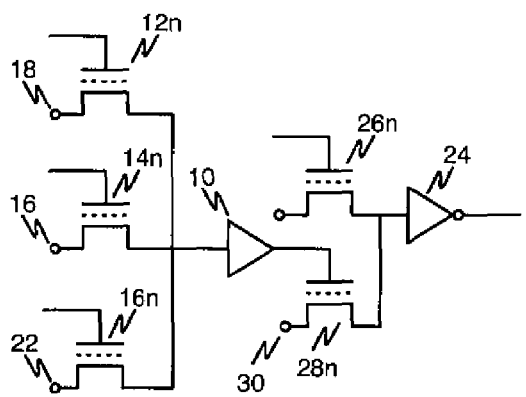
FIGURE 2A
FIGURE 2B

APPARATUS AND METHOD FOR REDUCING LEAKAGE OF UNUSED BUFFERS IN AN INTEGRATED CIRCUIT

BACKGROUND OF THE INVENTION

1. Field of the Invention

The present invention relates to integrated circuits. More particularly, the present invention relates to apparatus and methods for reducing leakage in unused ones of the buffers employed for making interconnections in integrated circuits such as field programmable gate arrays (FPGAs) and other programmable logic devices (PLDs).

2. The Prior Art

Configurable integrated circuits such as FPGAs and other programmable logic devices require numerous inverting or non-inverting buffers to implement interconnections. Because the buffers may drive substantial capacitive loads in some cases, they are usually designed using relatively large transistors. FPGA routing typically consists of a multiplexer whose select inputs are set at configuration time and a buffer driven by the output of the multiplexer. Most multiplexer inputs are driven by ordinary variable logic signals. An additional input may be present to force an unused buffer into a known fixed state; this is done by providing a way to "tie off" the input of an unused buffer to either 0V or $V_{CC}$.

With submicron VLSI processes, leakage current through the large transistors used in the interconnection buffers can be substantial even when they are turned off. This wastes power.

Various techniques have been proposed to reduce leakage of used or unused buffers in FPGAs, including altering the bias of the wells containing the buffer transistors, and selective use of transistors with different threshold voltages. Other methods have also been proposed.

BRIEF DESCRIPTION OF THE INVENTION

An interconnect circuit includes a buffer having an input and an output, at least one multiplexer transistor coupled between a multiplexer input node and the input of the buffer, and a fixed-state multiplexer transistor coupled between a fixed-state multiplexer input node and the input of the buffer, the fixed-state multiplexer input node having a potential of either less than zero volts or more than $V_{CC}$ present on its input terminal.

BRIEF DESCRIPTION OF THE DRAWING FIGURES

FIGS. 1A and 1B are schematic diagrams of two examples of an apparatus for reducing leakage in an unused buffer employed for making interconnections in FPGAs in which FIG. 1A employs MOS transistors and FIG. 1B employs nonvolatile transistors.

FIGS. 2A and 2B are schematic diagrams of two examples of an apparatus for reducing leakage in an unused 2-stage buffer employed for making interconnections in FPGAs in which FIG. 2A employs MOS transistors and FIG. 2B employs nonvolatile transistors.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Inverting and non-inverting buffers are used to route signals and implement interconnections in configurable integrated circuits such as FPGAs and other PLDs. FPGA routing typically consists of a multiplexer whose select inputs are set at configuration time and a buffer driven by the output of the multiplexer. Most multiplexer inputs are driven by ordinary variable logic signals. An additional input may be present to force an unused buffer into a known fixed state; this is done by providing a way to "tie off" the input of an unused buffer to either 0V or $V_{CC}$.

Instead of connecting the tie-off input to 0 or $V_{CC}$, it is connected to a voltage slightly below 0 or slightly above $V_{CC}$ (e.g., a 0.1 volt differential). This has the effect of greatly reducing the leakage of either the N or P device, respectively, in the first (or sole) stage of the buffer.

Such an arrangement is depicted in FIGS. 1A and 1B. In FIG. 1A, inverting buffer 10 is driven by the output of a multiplexer formed from n-channel MOS transistors 12, 14, and 16 that passes the input at node 18 to the input of inverting buffer 10 when n-channel multiplexer transistor 12 is turned on by presenting an appropriate input to its gate and passes the input at node 20 to the input of inverting buffer 10 when n-channel MOS multiplexer transistor 14 is turned on by presenting an appropriate input to its gate. In FIG. 1B, the same circuit is shown employing nonvolatile transistors 12n, 14n, and 16n in place of n-channel MOS transistors 12, 14, and 16. Nonvolatile transistors 12n, 14n, and 16n in place of n-channel MOS transistors 12, 14, and 16 may be programmed using well-known circuits and methods.

If neither multiplexer transistor 12 nor multiplexer transistor 14 is turned on, fixed-state multiplexer transistor 16 may be turned on to place the input to inverting buffer 10 to a fixed state. According to the present invention, the voltage at fixed-state multiplexer input node 22 may be set at either a value that is less than zero (e.g., about −0.1V) or more than $V_{CC}$ (e.g., about 0.1 volts greater than $V_{CC}$, i.e., about 1.6V if $V_{CC}$ is 1.5V). If n-channel MOS fixed-state multiplexer transistor 16 is a normal transistor, its gate should be driven by a voltage greater than the voltage at fixed-state multiplexer input node input node 22 (at least one $V_t$ larger) as is known in the art.

In a programmable logic device such as an FPGA, placement and routing software is used to map an end-user design into a particular configurable logic device. As part of this task the software identifies which buffers are used and which are unused. It can then set appropriate bits in the bitstream used to configure the device to connect muxes driving unused buffers to the sub-ground or super-$V_{CC}$ input.

The choice of the state into which the input of an unused inverting buffer should be placed can depend on several factors. For an SRAM-based FPGA using ordinary NMOS multiplexer transistors, it may be preferable to place a voltage below ground at the input to transistor 16. On the other hand, for a flash-based FPGA, where transistor 16 can pass voltages above $V_{CC}$, a voltage greater than $V_{CC}$ may be preferable. In addition, the use of the voltage greater than $V_{CC}$ has the added advantage of reducing the leakage through transistors 12, 14 and 16 when they are off.

If a non-inverting buffer is required in the design, persons of ordinary skill in the art will appreciate that it may easily be implemented using two cascaded inverters. According to the present invention, an additional 2-input multiplexer may be inserted between the inverter stages so that the second buffer stage can be similarly controlled. Two examples of such an arrangement are illustrated in FIGS. 2A and 2B. FIG. 2A depicts a circuit utilizing n-channel MOS transistors and FIG. 2B depicts the same circuit employing n-channel MOS nonvolatile transistors.

Referring now to FIGS. 2A and 2B, a portion of the circuit is the same as the circuit depicted in FIGS. 1A and 1B. Accordingly, inverting buffer 10 is driven by the output of a multiplexer that passes the input at node 18 to the input of inverting buffer 10 when transistor 12 is turned on by presenting an appropriate input to its gate and passes the input at node 20 to the input of inverting buffer 10 when n-channel MOS transistor 14 is turned on by presenting an appropriate input to its gate.

In addition to the aforementioned elements of FIG. 2A that are present in FIG. 1A, the circuit of FIG. 2A also includes a second inverting buffer 24. N-channel MOS transistor 26 passes the output of inverting buffer 10 to the input of inverting buffer 24 when an appropriate voltage is presented at its gate. If, however, the two-stage buffer including inverting buffer 10 and inverting buffer 24 is not to be used, n-channel MOS transistor 26 is turned off and n-channel MOS transistor 28 is turned on, and the potential at fixed-state multiplexer input node 30 is presented to the input of inverting buffer 24. According to the present invention, that potential may be set at either a value that is less than zero (e.g., about −0.1V) or more than $V_{CC}$ (e.g., about 0.1 volts greater than $V_{CC}$, i.e., about 1.6V if $V_{CC}$ is 1.5V). The circuit of FIG. 2B operates in the same manner as the circuit of FIG. 2A with the exception that nonvolatile transistors 12n, 14n, 16n, 26n, and 28n are employed in place of n-channel MOS transistors 12, 14, 16, 26, and 28.

As persons of ordinary skill in the art will appreciate, other circuits normally present in an FPGA integrated circuit (not shown) are used to provide the potentials at nodes 22 and 30 of the circuits of FIGS. 1A, 1B, 2A, and 2B. These circuits, such as charge pump circuits, are well known and disclosure of them is not necessary to understand the concepts of the present invention. In addition, such skilled persons will also appreciate that circuits capable of generating the inputs presented to nodes 18 and 20 are present in the integrated circuit. Circuits for performing this function are also known and disclosure of them is not necessary to understand the concepts of the present invention.

The use of either the sub-ground or super-$V_{CC}$ voltage to the gates of unused buffers may be different for different types of circuit configurations. These differences will be apparent to persons skilled in the art. For example, depending on what type of switch device is used, one or the other voltage might be more easily tolerated. For instance, switches fabricated using floating gate or other non-volatile memory transistor technology would be able to tolerate and pass voltages greater than $V_{CC}$ through to the buffer. Low-voltage switches controlled by SRAM might not be able to tolerate these voltages, making sub-ground voltage the appropriate choice.

Assuming NMOS pass gates or flash devices are used to implement the switches, use of greater-than-$V_{CC}$ voltage according to the present invention has the added advantage of reducing leakage through the turned off switches. (The turned off switches are the ordinary switches connected to normal inputs when the buffer is unused, or the added switch connected to greater-than-$V_{CC}$ voltage when the buffer is used.)

The present invention may be especially useful when then multiplexers preceding buffers 10 and 24 are made of flash devices or are transistors with a thicker-than-normal oxide and/or driven by a gate voltage exceeding $V_{CC}$ when on. This is typical for flash-based FPGAs.

The buffer 10 (or 24) may be implemented as an ordinary two-transistor inverter. However it could also be a more complicated inverting or non-inverting buffer circuit. As long as it has the characteristic that its leakage is reduced when the input is set to a sub-ground or super-VCC potential, the goal of the invention will be achieved.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An interconnect circuit including:
    a buffer having an input and an output;
    at least one multiplexer transistor coupled between a multiplexer input node and the input of the buffer, the multiplexer input node biased at a potential of either zero volts or $V_{CC}$; and
    a fixed-state multiplexer transistor coupled between a fixed-state multiplexer input node and the input of the buffer, the fixed-state multiplexer input node biased at a potential of either less than zero volts or more than $V_{CC}$;
    wherein at least one multiplexer transistor and the fixed-state multiplexer transistor are transistors that can pass voltages above $V_{CC}$; and
    wherein at least one multiplexer transistor and the fixed-state multiplexer transistor are non-volatile transistors.

2. The interconnect circuit of claim 1, wherein the potential of less than zero volts is about 0.1V less than zero volts.

3. The interconnect circuit of claim 1, wherein the potential of more than $V_{CC}$ is about 0.1V more than $V_{CC}$.

4. The interconnect circuit of claim 1, wherein the at least one multiplexer transistor is at least two multiplexer transistors.

5. An interconnect circuit including:
    a first buffer having an input and an output;
    at least one first buffer multiplexer transistor coupled between a first buffer multiplexer input node and the input of the first buffer, the first buffer multiplexer input node biased at a potential of zero volts or $V_{CC}$;
    a fixed-state first buffer multiplexer transistor coupled between a fixed-state first buffer multiplexer input node and the input of the first buffer, the fixed-state first buffer multiplexer input node biased at a potential of either less than zero volts or more than $V_{CC}$;
    a second buffer having an input and an output;
    a second buffer enable transistor coupled between the output of the first buffer and the input of the second buffer, the second buffer enable transistor having a gate connected to an enable node;
    a fixed-state second buffer multiplexer transistor coupled between a fixed-state second buffer multiplexer input node and the input of the second buffer, the fixed-state second buffer multiplexer input node biased at a potential of either less than zero volts or more than $V_{CC}$;
    wherein at least one first buffer multiplexer transistor and the fixed-state first and second buffer multiplexer transistors are transistors that can pass voltages above $V_{CC}$; an
    wherein the least one first buffer multiplexer transistor, the second buffer multiplexer transistor, the fixed-state first multiplexer transistor, and the fixed-state second multiplexer transistor are non-volatile transistors.

6. The interconnect circuit of claim 5, further including at least one additional multiplexer transistor coupled between a varying signal and the input of the second buffer.

7. The interconnect circuit of claim 5, wherein the potential of less than zero volts is about 0.1V less than zero volts and the potential of more than $V_{CC}$ is about 0.1V more than $V_{CC}$.

8. The interconnect circuit of claim 5, wherein the least one first buffer multiplexer transistor, the second buffer multiplexer transistor, the fixed-state first multiplexer transistor, and the fixed-state second multiplexer transistor are non-volatile transistors.

9. In a programmable integrated circuit having interconnect circuits each including a buffer having an input and an output and at least one multiplexer transistor coupled between a multiplexer input node and the input of the buffer and a fixed-state multiplexer transistor coupled between a fixed-state multiplexer input node and the input of the buffer, a method for reducing leakage in unused ones of the buffers including:
 determining a group of the buffers that are unused in a user configuration of the programmable integrated circuit; and
 programming the programmable integrated circuit to apply a potential of either less than zero volts or more than $V_{CC}$ to the fixed-state multiplexer input node.

* * * * *